US007020021B1

(12) United States Patent
Leung et al.

(10) Patent No.: US 7,020,021 B1
(45) Date of Patent: Mar. 28, 2006

(54) RAMPED SOFT PROGRAMMING FOR CONTROL OF ERASE VOLTAGE DISTRIBUTIONS IN FLASH MEMORY DEVICES

(75) Inventors: Wing-Han Leung, Sunnyvale, CA (US); Richard M. Fastow, Cupertino, CA (US); Yue-Song He, San Jose, CA (US); Sheung-Hee Park, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/981,833

(22) Filed: Nov. 4, 2004

(51) Int. Cl.
*G11C 16/04* (2006.01)

(52) U.S. Cl. ............................... 365/185.19; 365/185.3

(58) Field of Classification Search ........... 365/185.19, 365/185.3, 185.33, 185.01
See application file for complete search history.

(56) References Cited

U.S. PATENT DOCUMENTS 6,252,803 B1 * 6/2001 Fastow et al. ......... 365/185.22
6,285,588 B1 * 9/2001 Fastow .................. 365/185.19
6,515,908 B1 * 2/2003 Miyawaki et al. ..... 365/185.22

* cited by examiner

*Primary Examiner*—Vu A. Le

(57) ABSTRACT

A method of erasing bits in a multi-level cell flash memory array is described. The method includes applying over-erase verification after each erase pulse. If cells verify as over-erased, a ramped over-erase correction pulse is applied. The voltage of each over-erase correction pulse is incrementally greater than the previous pulse, until all bits in all cells pass the over-erase verification. In this way, the widths of the threshold voltage distributions of the erased bits are kept to a minimum.

16 Claims, 4 Drawing Sheets

FLASH MEMORY DEVICE IN ERASE MODE

RAMPED SOFT PROGRAMMING FOR CONTROL OF ERASE VOLTAGE DISTRIBUTIONS IN FLASH MEMORY DEVICES

FIELD

The present invention relates to multi-level cell non-volatile FLASH memory. Specifically, the present invention relates to a method for tightening the distribution of the threshold voltages of the erased bits in a multi-level cell flash memory device.

BACKGROUND

A microelectronic flash or block erase Electrically Erasable Programmable Read-Only Memory (EEPROM) includes an array of cells that can be independently programmed and read. The size of each cell and thereby the memory are made small by omitting transistors known as select transistors that enable the cells to be erased independently. As a result, all of the cells are erased together as a block.

A memory of this type includes individual Metal Oxide Semiconductor Field Effect Transistor (MOSFET) memory cells, each of which includes a source, a drain, a floating gate and a control gate to which various voltages can be applied to program and erase each cell. Upon reading, each programmed level within a cell reads as a binary 0, and each erased level within a cell reads as a binary 1.

The cells are connected in an array of rows and columns, with the control gates of the cells in a row being connected to a respective wordline and the drains of the cells in a column being connected to a respective bitline. The sources of the cells are connected together. This arrangement is known as a NOR memory configuration.

A cell is programmed by applying a voltage, typically 9 or 10 V to the control gate, applying a voltage of approximately 5V to the drain and grounding the source, which causes hot electrons to be injected from a drain depletion region into the floating gate. Upon removal of the programming voltages, the injected electrons are trapped. These trapped electrons lack the energy to jump back off the floating gate, and as they collect on the floating gate, the threshold voltage increases. The desired threshold voltage of a programmed level of a cell is at least 4 V.

A cell is read by applying typically 5V to the control gate, applying 1 V to the bitline to which the drain is connected, grounding the source, and sensing the bitline current. If the cell is programmed and the threshold voltage is relatively high (4V), the bitline current will be zero or at least relatively low. The programmed cell is read as a binary “0.” If the cell is erased, the threshold voltage will be relatively low (2V), the control gate will enhance the channel, and the bitline current will be relatively high. The erased cell is read as a binary “1.”

A programmed cell can be erased in several ways. In one arrangement, a cell is erased by applying a relatively high voltage, typically 12 V, to the source, grounding the control gate and allowing the drain to float. This causes the electrons that were injected into the floating gate during programming to undergo Fowler-Nordheim tunneling from the floating gate through the thin tunnel oxide layer to the source. A cell can also be erased by applying a negative voltage on the order of −10 V to the control gate, applying 5V to the source and allowing the drain to float. Another method of erasing is by applying 5V to the P-well and −10V to the control gate while allowing the source/drain to float.

A problem with conventional flash EEPROM cell arrangement is that due to manufacturing tolerances, some cells become over-erased before other cells become erased sufficiently. The floating gates of the over-erased cells are depleted of electrons and become positively charged. This causes the over-erased cells to function as depletion mode transistors that cannot be turned off by normal operating voltages applied to their control gates. The cells functioning as depletion mode transistors introduce leakage current during subsequent program and read operations.

More specifically, during program and read operations only one wordline that is connected to the control gates of a row of cells is held high at a time, while the other wordlines are grounded. However, a positive voltage is applied to the drains of all of the cells and if the threshold voltage of an unselected cell is zero or negative, the leakage current will flow through the source, channel and drain of the cell.

The undesirable effect of the leakage current from the over-erased cells is as follows. In a typical flash EEPROM, the drains of a large number of memory transistor cells, for example 512 transistor cells are connected to each bit line. If a substantial number of cells on the bitline are drawing background leakage current, the total leakage current on the bitline can exceed the cell read current. This makes it impossible to read the state of any cell on the bitline and therefore renders the memory inoperative.

Because the background leakage current of a cell varies as a function of threshold voltage, the lower (more negative) the threshold voltage the higher the leakage current. It is therefore desirable to prevent cells from being over-erased and reduce the threshold voltage distribution to as narrow a range as possible, with ideally all cells having the same threshold voltage after erase at 2V.

It is known in the art to reduce the threshold voltage distribution by performing an over-erase correction operation, which reprograms the most over-erased cells back up to a higher threshold voltage of 2 V. An over-erase correction operation of this type is generally known as Automatic Program Disturb (APD).

Following application of an erase pulse, under-erase correction is first performed on a cell-by-cell basis by rows. The cell in the first row and column position is addressed and erase verified by applying 4V to the control gate (wordline), 1 V to the drain (bitline), grounding the source, and using sense amplifiers to sense the bitline current and thereby determine if the threshold voltage of the cell is above the acceptable value of 2V. If the cell is under-erased, indicated by a threshold voltage above 2V, the bitline current will be low. In this case, an erase pulse is applied to all of the cells.

After application of each erase pulse and prior to a subsequent erase verify operation, over-erase correction is performed on all of the cells of the memory. Over-erase verify is performed on the bitlines of the array in sequence. This is accomplished by grounding the wordlines, and applying typically 1V to the first bitline, and sensing the bitline current. If the current is above a predetermined value, this indicates that at least one of the cells connected to the bitline is over-erased and is drawing leakage current. In this case, an over-erase pulse correction pulse is applied to the bitline. This is accomplished by applying 5 V to 6 V to the bitline for a predetermined length of time such as 10 micro seconds.

After application of the over-erase correction pulse the bitline is over-erase verified again. If bitline current is still high indicating that an over-erased cell still remains connected to the bitline, another over-erase correction pulse is applied. This procedure is repeated for all of the bitlines in sequence.

The procedure is repeated as many times as necessary until the bitline current is reduced to the predetermined value (2V), which is lower than the read current (5 V). Then, the procedure is performed for the rest of the cells in the first row and following rows until all of the cells in the memory have been erase verified.

By performing the over-erase correction procedure after each erase pulse, the extent to which cells are over-erased is reduced, improving the endurance of cells. Further, because over-erased cells are corrected after each pulse, bitline leakage current is reduced during erase verify, thus preventing under-erased cells from existing upon completion of the erase verify procedure.

The erase procedure causes electron trapping to occur in the tunnel oxide. In addition, the undererase and overerase procedures cause electron trapping to occur in the tunnel oxide. Although each programming/erase cycle adds only a small number of trapped electrons, the cumulative electron trapping increases as each programming/erase cycle is completed which, in turn, increasing degrades the erase time.

In multi-level flash memory cells, each cell is divided into two bits. Each bit can be either programmed (logical "0") or erased (logical "1"). As shown in FIG. 2, each cell can manifest four unique states ("00," "01," "10," and "11"). The gaps between the programmed-state threshold voltage and the erased-state threshold voltage of each bit are narrow, and must be maintained to ensure read accuracy. A disturbance of a few milli-Volts would not affect the read accuracy of a single-level flash memory cell. However, in a multi-level flash memory cell, such disturbances may render and reading of the bits useless.

What is needed are ways to tighten threshold voltage distributions of logical states in multi-level flash memory cells.

SUMMARY

One embodiment of the present invention pertains to a method of controlling the erase voltage distributions in a flash memory device. The method includes applying an erase pulse, verifying for under-erased bits, verifying for over-erased bits, and applying ramped over-erase correction pulses until all cells pass the over-erase verification, at which point the next erase pulse can be applied to correct any under-erased bits.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Reference will now be made in detail to various embodiments of the invention, examples of which are illustrated, by way of example and not by way of limitation, in the accompanying drawings. The drawings referred to in this description should not be understood as being drawn to scale except if specifically noted.

Figure 1:
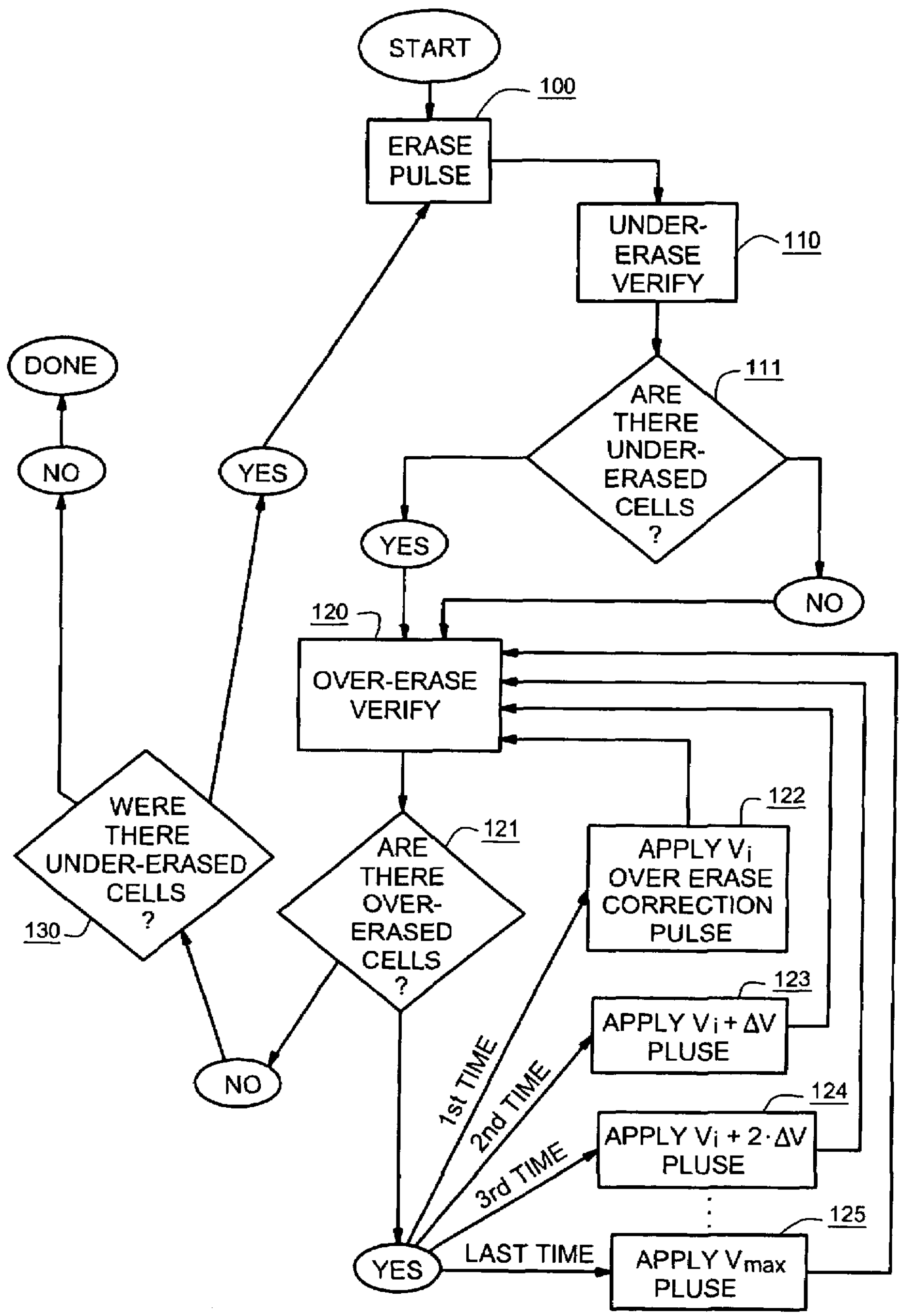
FIG. 1 is a flow chart illustrating the process by which the multi-level flash device determines if there are any under-erased or over-erased cells, and how it corrects for either of these two. The method of correcting for over-erased cells includes a cycle of verification, application of correction pulse, verification, increasing voltage of correction pulse, applying correction pulse, and so on until no cells verify as over-erased.

FIG. 1 shows the procedure for erasing the cells in a multi-level flash Electrical Erasable Programmable Read Only Memory device. First, An erase pulse is sent to all cells (100). Next, an under-erase verify is performed on all cells (110) to determine whether or not any cells are under-erased (111). Before any subsequent erase pulses are applied, an over-erase verify is applied (120). It is necessary to apply the over-erase verify before subsequent erase pulses, for the application of an erase pulse to a cell which is already over-erased would be redundant and could cause read errors.

If any cells are determined to be over-erased (121), an over-erase correction pulse is applied, beginning at $V_i$ (122). Next, an over-erase verify pulse is applied (120). If any cells are determined to be over-erased (121), another over-erase correction pulse is applied, at $V_i+\Delta V$ (123). Next, another over-erase verify pulse is applied (120). If any cells are determined to be over-erased (121), another over-erase correction pulse is applied, at $V_i+2\cdot\Delta V$ (124), and so on until all cells pass the over-erase verification, i.e. no cells are over-erased. By ramping or stepping the over-erase correction pulse, a tighter voltage distribution of the erased bits will be achieved. When over-erase correction pulses are applied at a constant high voltage, some cells are over-corrected, resulting in wider voltage distributions.

Once it is determined that there are no over-erased cells (121), if there were no under-erased cells (130), the erase process is finished. If there were under-erased cells (130), an erase pulse is applied (100), and the whole process starts again. It is essential to run an over-erase verify and correction (if necessary) after each erase pulse. Over-erased cells result in read errors.

Figure 2:
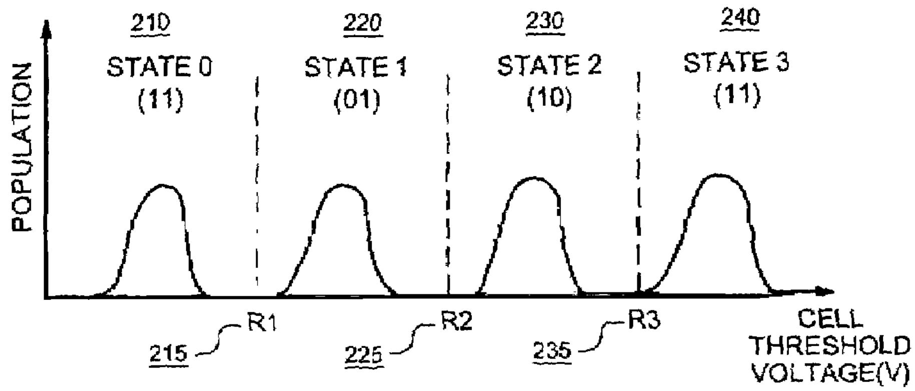
FIG. 2 illustrates the separate states of a multi-level flash memory cell. The voltage distribution of each state must be kept tight and separate from the voltage distribution of its neighboring states.

FIG. 2 illustrates the desired voltage distributions of the four logical states in a 2-level flash memory array. State 0 (210), or logical "11," corresponds to cells having two erased bits. States 1 (220) and 2, (230) or logical "01" and "10," correspond to cells having one erased bit and one programmed bit. State 3 (240), or logical "00," corresponds to cells having two programmed bits. In a multi-level flash memory device, it is necessary to keep the voltage distributions of the logical states separate and distinct.

Figure 3:
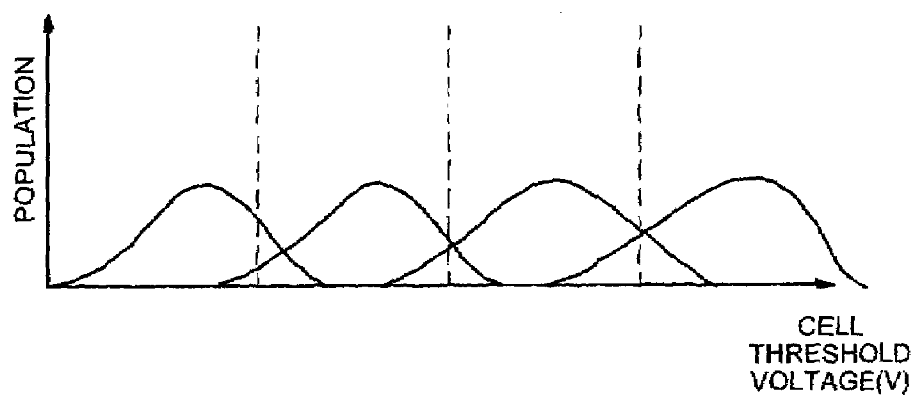
FIG. 3 illustrates the possible intermingling of states in a multi-level flash memory cell. Intermingling occurs if the voltage distributions are allowed to grow wide.

FIG. 3 illustrates the voltage distributions of the logical states in a multi-level flash memory device where the threshold voltage distributions of the states have not been kept separate. When the threshold voltage distributions are permitted to intermingle in this way, accurate reading of the bits is impossible. This situation could arise if the over-erase correction is performed at constant voltage, rather than ramped increasing voltages.

Figure 4:
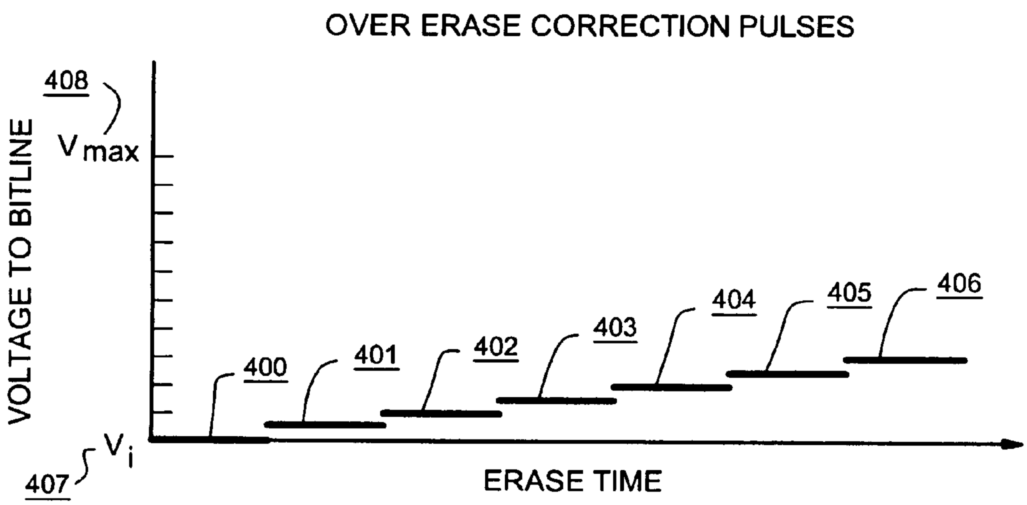
FIG. 4 illustrates the application of over-erase correction pulses at increasingly positive voltage.

FIG. 4 illustrates the application of over-erase correction pulses. The initial pulse (400) is at an initial voltage $V_i$ (407), for example 0V. It is applied for a predetermined length of time, for example 10 μs. After each pulse is applied, an over-erase verify is applied, as in FIG. 1. If the first pulse fails to correct all over-erased bits, another over-erase correction pulse is applied (401) at a voltage of $V_i+\Delta V$. The voltage of each successive over-erase correction pulse is greater than the previous pulse, up to a maximum voltage $V_{max}$(408), for example 5V. By ramping the over-erase correction pulses in this manner, a tighter threshold voltage distribution of the erased bits can be achieved.

Figure 5:
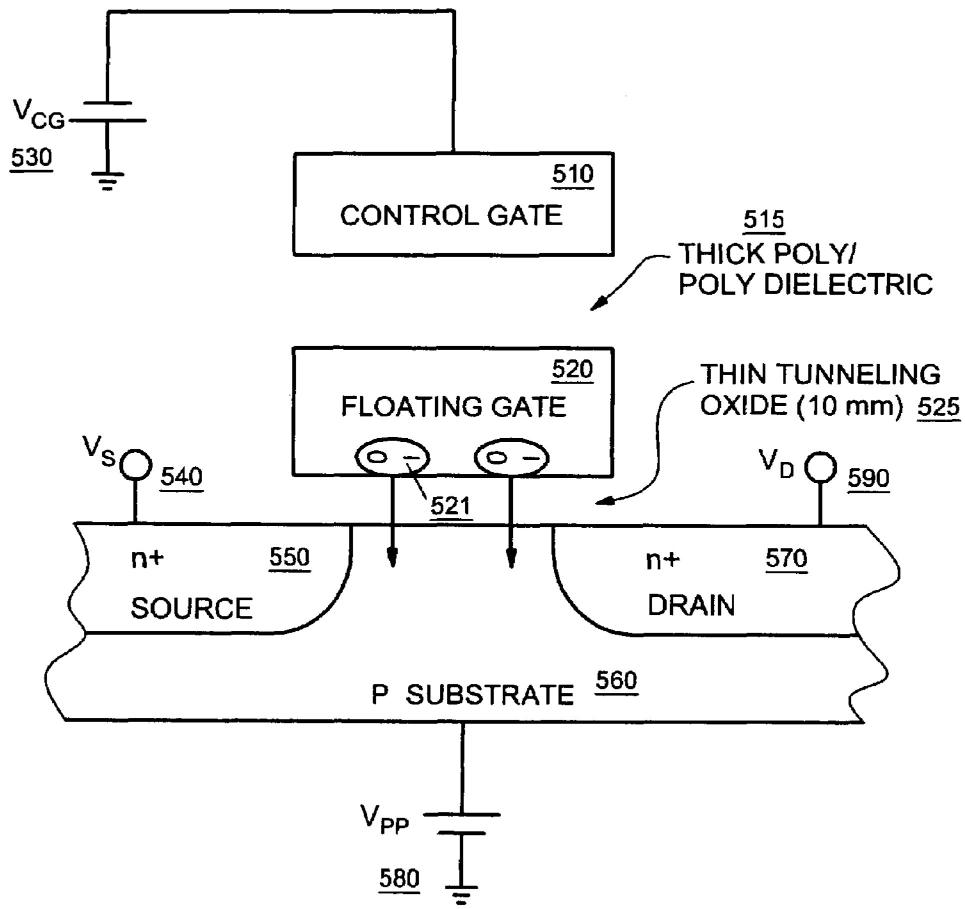
FIG. 5 illustrates a single-level flash memory cell.

FIG. 5 illustrates a single-level flash memory cell. If a bit is erased, the floating gate (520) has few trapped electrons (521), the threshold voltage is low, and current can flow from the source (550) to the drain (570). If a bit is under-erased, the floating gate (520) contains some trapped electrons (521), and the threshold voltage is higher than that of a properly erased bit. In an under-erased bit, not as much current can flow from the source (550) to the drain (570), therefore it may not produce a logical "1." In an over-erased bit, too many electrons have been removed from the floating gate (520), creating a negative threshold voltage, and during read the current flows backwards, i.e. from the drain (570) to the source (550). This backward-flowing current cancels out the current of other properly erased cells, resulting in read errors. In a multi-level flash memory cell, it is important that all levels are properly erased, i.e. not over-erased and not under-erased, for the reasons stated above. It is equally important that the voltage distributions of each state illustrated in FIG. 3 are as narrow as possible. Ramping the over-erase correction pulses is an effective method of achieving this goal.

When a cell is over-erased, too many electrons have been removed from the floating gate (520). In an over-erased cell, the threshold voltage is too low. The over-erase correction pulse cures this problem by applying voltage to the drain (570) via the bitline (590). The voltage to the source (540) is held high as in the erase pulse, but instead of allowing the drain to float as in the erase pulse, a voltage is applied to the drain (570) via the bitline (590). In this way, electrons are attracted back onto the floating gate (520), raising the threshold voltage. Ramping voltage of the over-erase correction pulses allows electrons to be attracted back onto the floating gate (520) a few at a time. Once a sufficient amount of electrons have been attracted to the floating gate (520), i.e., the threshold voltage has been raised to the erased-state voltage, i.e. current can flow from the from the source (550) to the drain (570), over-erase correction is done and the next step in the erase procedure is performed, as in FIG. 1. When over-erase correction pulses are applied at a constant high voltage, for example 1V, a possible outcome is that too many electrons are attracted back onto the floating gate (520), resulting in an under-erased cell. Ramping the voltage of the over-erase correction pulses prevents over-shooting and allows for better control in achieving the proper threshold voltage for the cell to read as erased.

What is claimed is:

1. A method for performing over-erase correction after erase in a flash Electrically-Erasable Programmable Read Only Memory (EEPROM) that includes a plurality of field-effect transistor memory cells each having a source, a drain, a bitline connected to said drain, a floating gate, a well and a control gate, the method comprising:

(a) applying an overerase verify pulse after each erase pulse in the erase process to determine if one of the flash memory cells is overerased;

(b) applying an overerase correction pulse after each determining step indicates an overerased cell exists;

(c) applying an overerase verify pulse after each overerase correction pulse, and if one of the flash memory cells is overerased, applying an incremented overerase correction pulse;

(d) incrementing the voltage of each successive overerase correction pulse by $\Delta V$; and (e) repeating (a)–(d) until none of said plurality of cells verifies as over-erased.

2. The method of claim 1, wherein over-erased cells are detected by the presence of a bitline leakage current.

3. The method of claim 1, wherein (c) is accomplished by applying a ramped voltage to the bitline.

4. The method of claim 1, wherein (c) is accomplished by applying a stepped voltage to the bitline.

5. The method of claim 1, wherein (c) is accomplished by applying an increasing positive voltage.

6. The method of claim 1, wherein the voltage to the bitline is increased in equal increments.

7. The method of claim 1, wherein the voltage to the bitline is increased in unequal increments.

8. The method of claim 1, wherein the complete correction of over-erased cells is determined by the absence of a bitline leakage current.

9. The method of claim 1, wherein each over-erase correction pulse is applied for a duration of 10–100 micro seconds.

10. The method of claim 1, wherein each cell is verified for over-erase after each over-erase correction pulse is applied.

11. A multi-level flash Electrically Erasable Programmable Read Only Memory (EEPROM) device that includes a plurality of field-effect transistor memory cells each having a source, a drain, a bitline connected to said drain, a floating gate, a well and a control gate comprising:

a means for programming each level of each cell;

a means for reading each level of each cell;

a means for erasing each level of each cell;

a means for verifying each level of each cell for under-erase;

a means for correcting any undererased cells;

a means for verifying each level of each cell for over-erase; and a means for correcting any over-erased cells by using an incremented voltage applied to the bitline.

12. The apparatus of claim 11, wherein the over-erase correction voltage to the bitline is ramped.

13. The apparatus of claim 11, wherein the over-erase correction voltage to the bitline is stepped.

14. The apparatus of claim 11, wherein the over-erase correction voltage to the bitline is incremented by applying an increasingly positive voltage.

15. The apparatus of claim 11, wherein the over-erase correction voltage to the bitline is increased in equal increments.

16. The apparatus of claim 11, wherein the over-erase correction voltage to the bitline is increased in unequal increments.

* * * * *